United States Patent [19]

(12) United States Patent
Kennedy

(10) Patent No.: US 10,746,575 B2
(45) Date of Patent: Aug. 18, 2020

(54) OUTSIDE MIRROR SIDE TURN INDICATOR WITH INTEGRATED BATTERY CHARGE DISPLAY FUNCTION

(71) Applicant: Magna Mirrors Holding GmbH, Sailauf (DE)

(72) Inventor: Mark Kennedy, Sailauf (DE)

(73) Assignee: MAGNA MIRRORS HOLDING GMBH, Sailauf (DE)

( * ) Notice: Subject to any disclaimer, the term of this patent is extended or adjusted under 35 U.S.C. 154(b) by 0 days.

(21) Appl. No.: 16/536,355

(22) Filed: Aug. 9, 2019

(65) Prior Publication Data

US 2020/0049534 A1 Feb. 13, 2020

Related U.S. Application Data

(60) Provisional application No. 62/717,966, filed on Aug. 13, 2018.

(51) Int. Cl.
| | |
|---|---|
| *B60Q 1/50* | (2006.01) |
| *G01D 7/00* | (2006.01) |
| *B60Q 1/34* | (2006.01) |
| *B60L 58/12* | (2019.01) |
| *B60Q 1/26* | (2006.01) |
| *F21S 43/14* | (2018.01) |
| *F21S 43/20* | (2018.01) |
| *G01R 31/36* | (2020.01) |
| *F21Y 115/10* | (2016.01) |

(52) U.S. Cl.
CPC ............. *G01D 7/005* (2013.01); *B60L 58/12* (2019.02); *B60Q 1/2665* (2013.01); *B60Q 1/34* (2013.01); *F21S 43/14* (2018.01); *F21S 43/26* (2018.01); *G01R 31/3646* (2019.01); *F21Y 2115/10* (2016.08)

(58) Field of Classification Search
CPC .......... G01D 7/005; F21S 43/14; F21S 43/26; G01R 31/3646; B60L 58/12; B60Q 1/2665; B60Q 1/34; F21Y 2115/10
See application file for complete search history.

(56) References Cited

U.S. PATENT DOCUMENTS

| | | |
|---|---|---|
| 4,214,683 A | 7/1980 | Wills et al. |
| 7,540,641 B2 | 6/2009 | Gardner et al. |

(Continued)

FOREIGN PATENT DOCUMENTS

WO    2018231906 A1    12/2018

*Primary Examiner* — Munear T Akki
(74) *Attorney, Agent, or Firm* — Honigman LLP

(57) ABSTRACT

A vehicular exterior mirror assembly includes a turn signal unit disposed at a mirror casing of the exterior mirror assembly. The turn signal unit includes a housing portion, at least one light source and a lens. With the exterior mirror assembly disposed at a side of an equipped vehicle, light emitted by the at least one light source, when the at least one light source is electrically powered, passes through the lens in the direction of forward travel of the equipped vehicle. With the exterior mirror assembly disposed at the side of the equipped vehicle, the turn signal unit (i) responsive to a charge level signal indicative of a vehicle charge level of a power source of the equipped vehicle, emits light to indicate the vehicle charge level, and (ii) responsive to actuation of a turn signal indicator of the equipped vehicle, emits light to provide a turn signal indication.

23 Claims, 5 Drawing Sheets

(56) References Cited

U.S. PATENT DOCUMENTS

| | | |
|---|---|---|
| 7,944,371 B2 | 5/2011 | Foote et al. |
| 8,134,334 B2 | 3/2012 | Suzuki et al. |
| 8,333,492 B2 | 12/2012 | Dingman et al. |
| 8,764,256 B2 | 7/2014 | Foote et al. |
| 9,656,599 B2 | 5/2017 | Hook et al. |
| 2007/0279923 A1 | 12/2007 | Rodriguez Barros et al. |
| 2008/0186726 A1 | 8/2008 | Okada |
| 2009/0278491 A1* | 11/2009 | Grider .................... B60L 53/16 320/107 |
| 2010/0045450 A1 | 2/2010 | Suzuki et al. |
| 2012/0086808 A1* | 4/2012 | Lynam .................. B60K 35/00 348/148 |
| 2013/0128333 A1* | 5/2013 | Agrawal .............. B60R 1/1207 359/273 |
| 2013/0238167 A1* | 9/2013 | Stanfield ................. G08G 1/20 701/2 |
| 2013/0242586 A1 | 9/2013 | Huizen et al. |
| 2018/0010760 A1 | 1/2018 | Juris et al. |
| 2018/0065544 A1* | 3/2018 | Brusco ................... B60L 58/13 |
| 2020/0005564 A1* | 1/2020 | Coburn ................... B60Q 1/50 |

* cited by examiner

OUTSIDE MIRROR SIDE TURN INDICATOR WITH INTEGRATED BATTERY CHARGE DISPLAY FUNCTION

CROSS REFERENCE TO RELATED APPLICATION

The present application claims the filing benefits of U.S. provisional patent application Ser. No. 62/717,966, filed Aug. 13, 2018, which is hereby incorporated herein by reference in its entirety.

FIELD OF THE INVENTION

The present invention relates generally to the field of exterior rearview mirror assemblies for vehicles and, more particularly, exterior rearview mirror assemblies that include a turn signal unit.

BACKGROUND OF THE INVENTION

External mirrors that comprise a turn signal unit are well known. They are increasingly popular additional turn signal devices in motor vehicles and on the one hand increase the safety of the vehicle and on the other hand enhance the vehicle aesthetically. Various embodiments of external mirrors with integrated turn signals are known, for example from US 2007/0279923.

SUMMARY OF THE INVENTION

The present invention provides a turn signal unit for an exterior mirror for a motor vehicle, wherein the turn signal unit is arranged, with the turn signal unit and the exterior mirror in the installation position, to radiate a flashing light forward in the direction of forward travel of the vehicle. The turn signal unit is also operable to emit light to indicate a vehicle charge level.

In accordance with an aspect of the present invention, a vehicular exterior mirror assembly includes a turn signal unit disposed at a mirror casing of the exterior mirror assembly. The turn signal unit comprises a housing portion, a light source and a lens, with the lens disposed in front of the light source and attached at the housing portion. The turn signal unit, when the exterior mirror assembly is disposed at a side of an equipped vehicle, is operable to emit light to indicate a vehicle charge level.

These and other objects, advantages, purposes and features of the present invention will become apparent upon review of the following specification in conjunction with the drawings.

DESCRIPTION OF THE PREFERRED EMBODIMENTS

Figure 1:
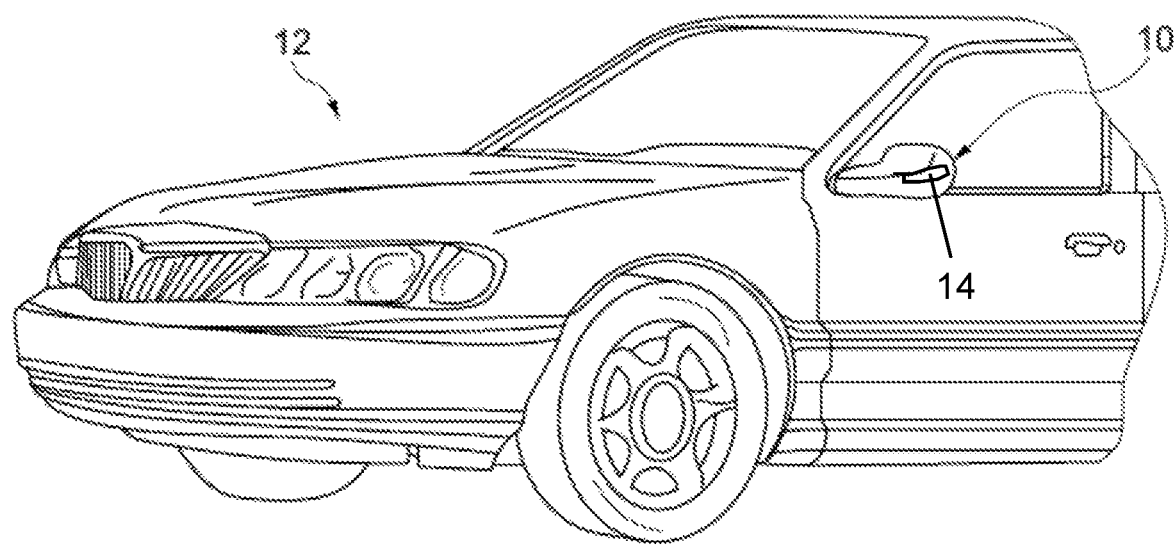
FIG. 1 is a perspective view of a vehicle with an exterior rearview mirror of the present invention.

Referring now to the drawings and the illustrative embodiments depicted therein, an exterior rearview mirror assembly 10 is mounted at a side of a vehicle 12 (FIG. 1). The exterior rearview mirror assembly includes a housing that acts as a support for the turn signal unit 14, a control unit 16, which can be implemented as a PCBA (Printed Circuit Board Assembly) and that can form an electrical input or optical input for a light source of the turn signal unit, and an at least partly light transmissive lens or cover element 18 (such as a transparent or clear light transmitting cover element or such as a colored or tinted light transmitting cover element) forming the boundary and front or exterior housing component of the turn signal unit 14 (see FIG. 3).

Figure 2:
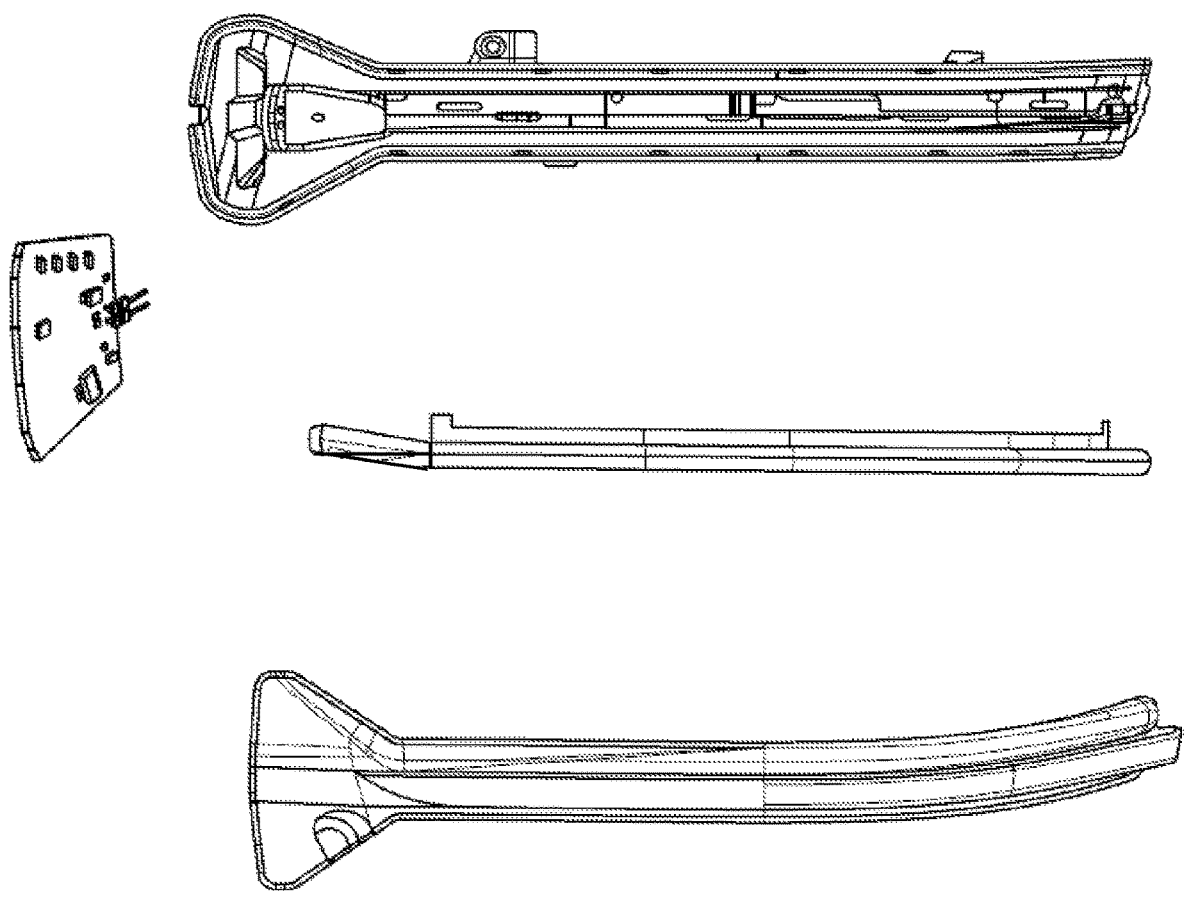
FIG. 2 is an exploded view of a turn signal unit for a known exterior rearview mirror assembly.

As shown in FIG. 2, exterior rearview mirror assemblies often include side turn indicators (STIs) that emit an amber light to indicate the vehicle's turn signal. Typically, only amber color is used, as other colors are not compliant with vehicle regulations (e.g., ECE R6, ECE R48). Such STIs commonly include a housing, a light guide, a lens and/or reflectors that directs emitted light outward from the STI to the surrounding area. When charging an electric vehicle, a vehicle charge level may not be obvious from outside the vehicle. During vehicle charging, the vehicle is in a non-operating state (e.g., parked), and therefore STIs may be repurposed for other functions during charging.

Figure 3:
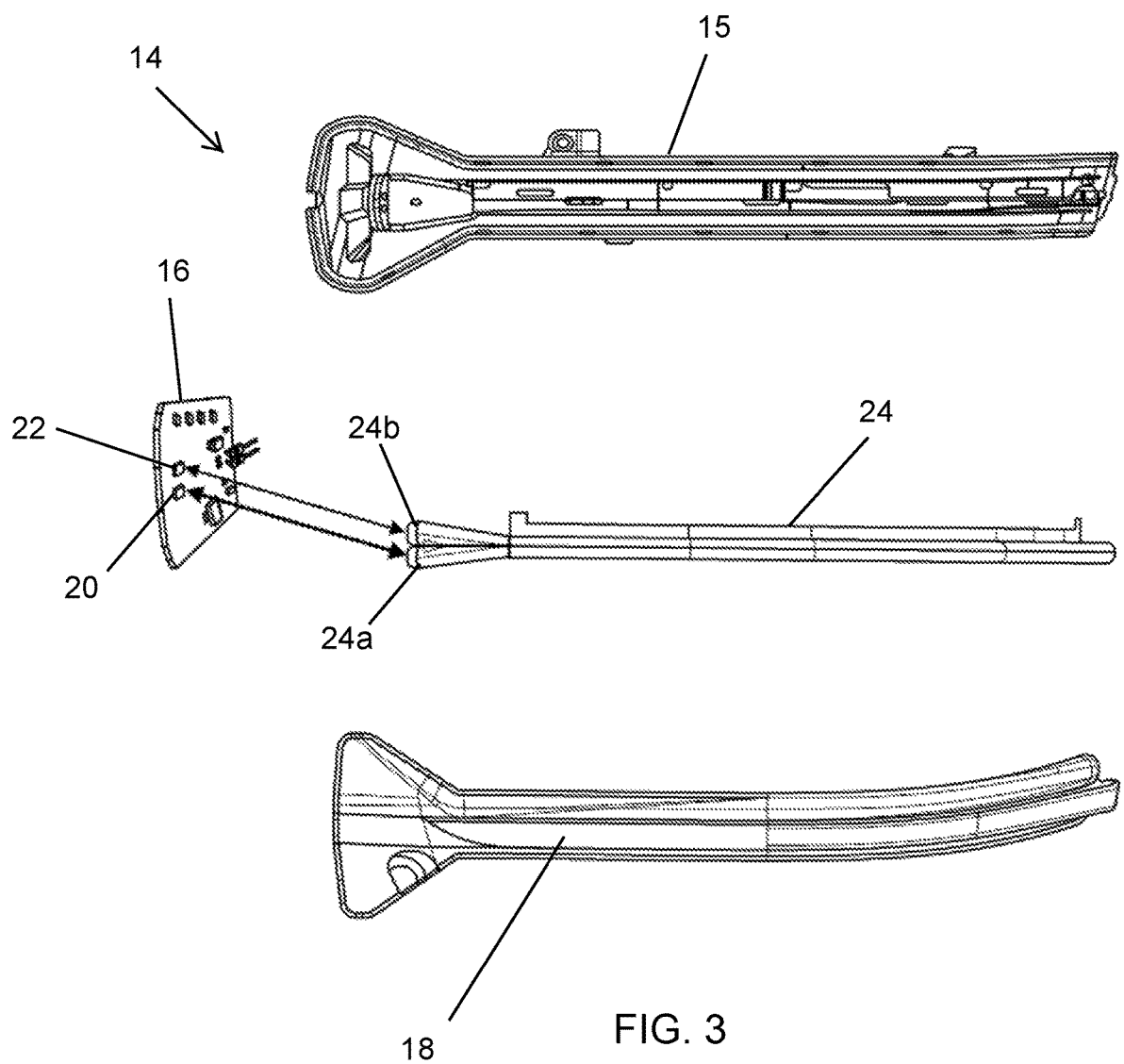
FIG. 3 is an exploded view of a turn signal unit with multicolor light emitting diodes (LEDs) to indicate a vehicle or battery charge level in accordance with the present invention.

As shown in FIG. 3, a side turn indicator or STI 14 may be equipped with one or more multicolored LEDs 20 in addition to an amber light-emitting LED 22 and a light guide or light pipe 24 disposed at a base portion 15 (which cooperates with the cover element 18 to encase the light guide 24 at the mirror assembly). The multicolored LED(s) 20 operates to indicate a charge level of the vehicle or vehicle battery or batteries, while the amber LED 22 operates to indicate a turn signal of the vehicle. The light guide 24 may comprise a single light guiding element with two separate inlets or light receiving portions 24a, 24b, with each light receiving portion 24a, 24b being disposed at and receiving light emitted by a respective one of the LEDs 20, 22. Alternatively, the light guide may have a single inlet or light receiving portion that receives light from either LED 20, 22. Since the multicolored LED or charge indicating LED 20 is only operable when the vehicle is parked or in a charge state and the amber LED or turn signal indicating LED 22 is only operable when the vehicle is operating (such as when being driven or maneuvered or when the vehicle ignition is on and when the turn signal indicator has been actuated), the LEDs will not operate at the same time so the light guide will be illuminated by only one of the LEDs at any given time.

The multicolored LED is capable of emitting a wide range of colors. When the vehicle is in a non-operating state (such as when parked or such as responsive to charging of the vehicle/battery), the multicolored LED may operate to indicate the vehicle charge level. For example, the multicolored LED may emit red light when the vehicle charge level is low, yellow light when the vehicle charge level is at half, and green light when the vehicle charge level is full. When the vehicle is in an operating state (such as when the vehicle is being driven or maneuvered along a road and such as responsive to actuation of a turn signal of the vehicle), the STI may then operate to only utilize amber light (either from a separate LED 22 or optionally from the multicolored LED 20 set or controlled to emit amber light) to indicate the vehicle's turn signal.

Optionally, for example, the STI may comprise a multicolor LED that emits amber light responsive to actuation of the turn signal indicator and that emits red, yellow or green responsive to a charge state signal when the vehicle is not operating. Alternatively, if a separate turn signal LED 22 is used for the turn signal indicator, the separate LED 22 (dedicated for indicating a turn signal) may emit amber light or optionally the turn signal LED 22 may emit white light, whereby the light guide 24 (or a portion of the light guide that is illuminated by the LED 22) may be colored so that it illuminates as an amber color when the LED 22 is energized. In such a configuration, another light guide (or a portion of the light guide) may comprise a clear element that is illuminated by the multi-colored LED to indicate the charge level.

Figure 4A:
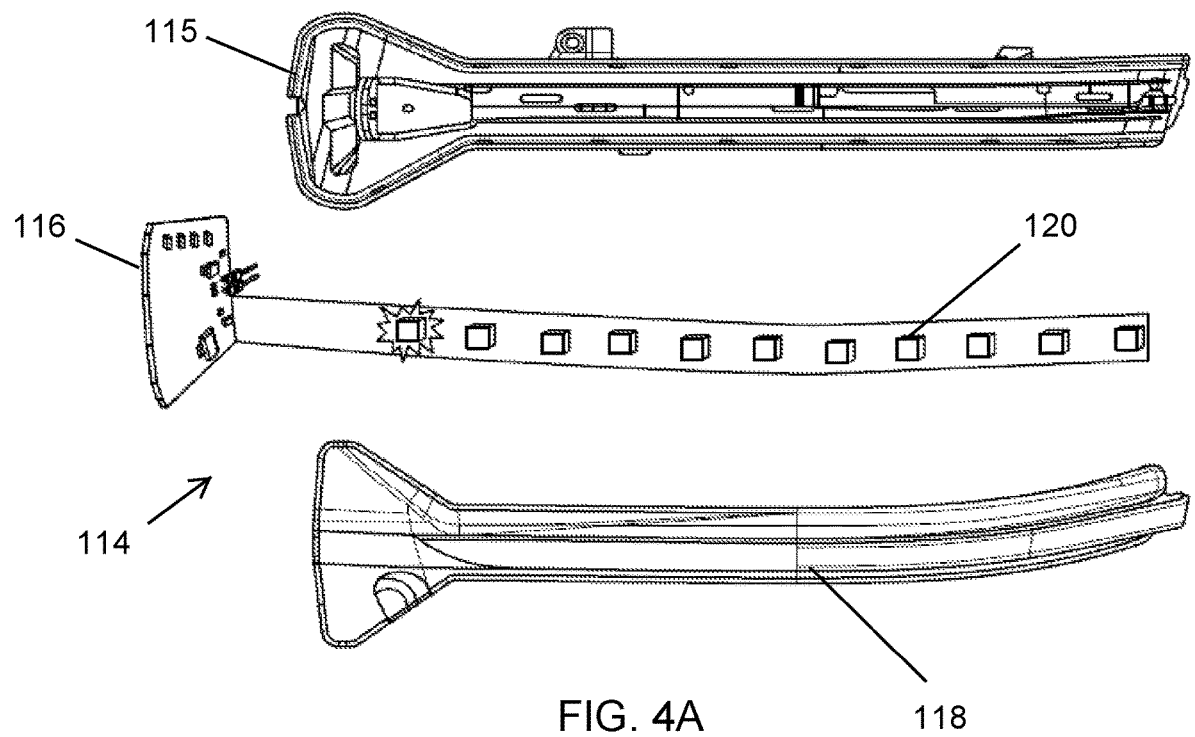
FIGS. 4A and 4B are exploded views of a turn signal unit with sequentially arranged and energized LEDs to indicate the vehicle charge level in accordance with the present invention.
Figure 4B:
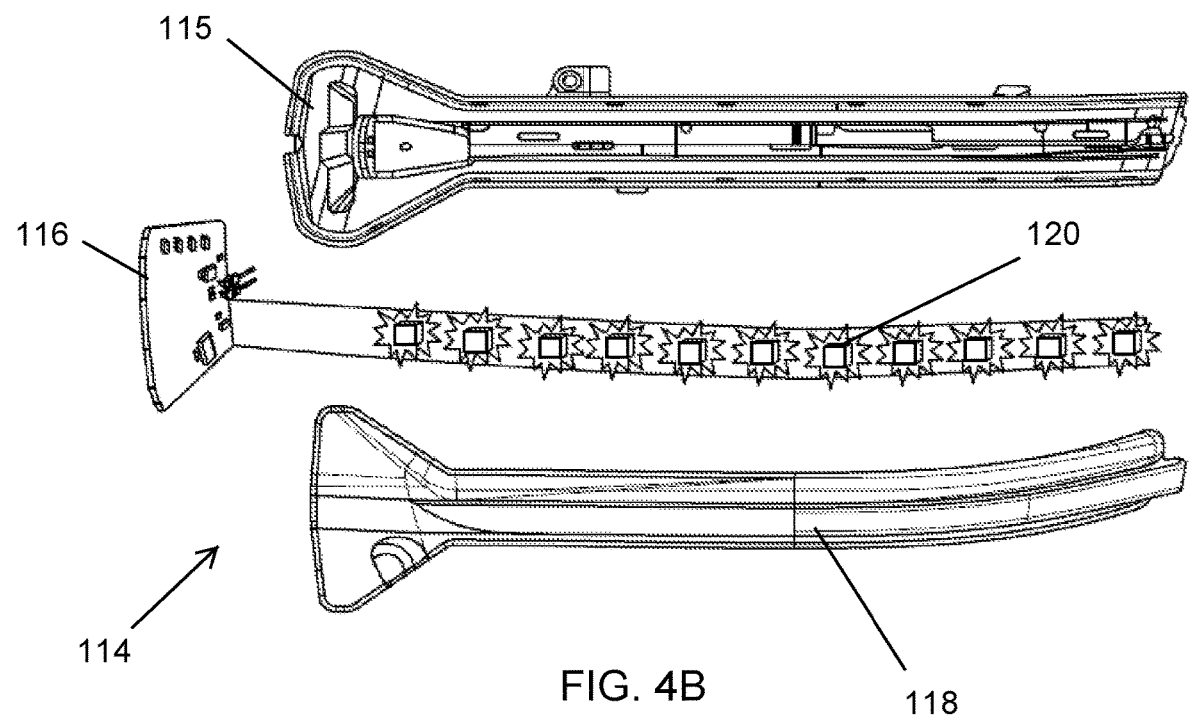

Referring now to FIGS. 4A and 4B, a side turn indicator or STI 114 may comprise a row (e.g., sequential arrangement) of LEDs 120 (of any color), such as may be linearly or otherwise arranged along a circuit element or strip and electrically connected to the circuit board or control unit 116. The LEDs 120 (and optionally other LEDs or a light guide) are disposed at and between the indicator base or housing 115 and the cover element 118. The LEDs 120 indicate the vehicle charge level when the vehicle is in a non-operating state. For example, when the vehicle charge level is low, zero or one (or other low quantity) of the LEDs 120 may be illuminated (FIG. 4A). When the vehicle charge level is high most or all of the LEDs 120 may be illuminated (FIG. 4B). For example, for an indicator with a row of ten LEDs (or 11 LEDs such as shown in FIGS. 4A and 4B), all of the LEDs may be energized when the battery is fully charged (as shown in FIG. 4B), with each LED representing about a 10 percent change (or about a 9.1 percent change if 11 LEDs) in charge level as compared to the adjacent LED(s). Thus, if the vehicle or battery is at 50 percent charge level, five of the LEDs would be energized, and if 10 percent charge level, only one LED would be energized (as shown in FIG. 4A). Optionally, when the charge level falls below a threshold amount (such as, for example, 20 percent), the one or two or three LEDs that are energized to indicate the charge level may be flashed or intermittently actuated to further draw a user's attention to the low battery charge level.

The LEDs 120 (or a separate row of LEDs or a light guide illuminated by a single dedicated LED) may function to emit amber light for the turn signal function when the vehicle is in an operating state (and responsive to actuation by a driver of the vehicle of the turn signal indicator). Optionally, for example, the STI 114 may include a row of LEDs (such as shown in FIGS. 4A and 4B) that emit, for example, red or green or white light, for providing the battery charge level indication, and the STI may also include a light guide that is illuminated via a single LED (such as similar to the light guide and LED shown in FIG. 3) so as to provide amber light for the turn signal indication.

Thus, the side turn signal indicator 14, 114 provides a turn signal indication function that emits amber light at the indicator responsive to a driver (or an autonomous vehicle control system) actuating a turn signal during operation of the vehicle. The indicator 14, 114 also provides a battery charge level indication function that indicates the charge level of the vehicle battery (for an electric vehicle) when the vehicle is not operating or not being driven (such as by a driver or an autonomous vehicle control system) or when the vehicle/battery is being charged.

Figure 5:
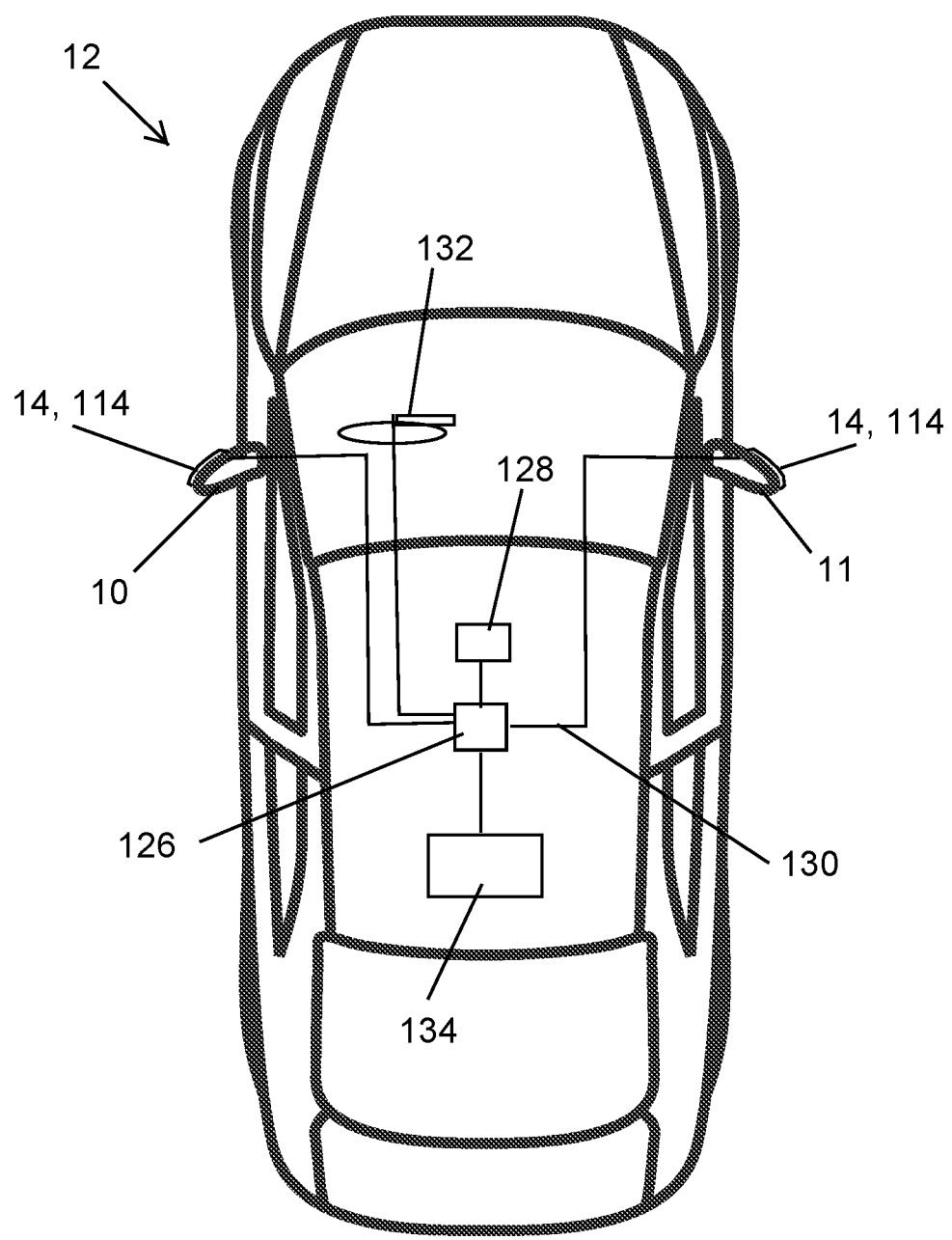
FIG. 5 is a plan view of a vehicle with a block diagram of the signal system including an indicator operable to emit light for a turn signal indication function and for a battery charge level indicator function.

As shown in FIG. 5, the indicator 14, 114 is disposed at one or both exterior rearview mirror assemblies 10, 11 of the vehicle and is/are in communication with a body control module (BCM) 126 and/or electronic control module (ECU) 128 of the vehicle, which are in communication with a vehicle bus or communication network 130 of the vehicle. The communication network 130 may communicate signals indicative of actuation of the turn signal actuator 132, such as responsive to actuation of a turn signal stalk or actuator at a steering column of the vehicle (or such as responsive to automatic actuation of a turn signal by an autonomous control system as the vehicle approaches an intersection at which the system plans to turn the vehicle), to the ECU and/or BCM (so that the indicator is actuated to emit amber light) and may communicate signals from a power source or battery charging system or charge monitoring system 134 to the ECU and/or BCM (such that the indicator is actuated to indicate the battery charge level). The indicator 14, 114 may be disposed at a driver side exterior rearview mirror assembly 10 (as shown in FIG. 1) or may be disposed at the passenger-side exterior rearview mirror assembly 11 or a respective indicator may be disposed at each of the driver side exterior rearview mirror assembly 10 and the passenger-side exterior rearview mirror assembly 11 (as shown in FIG. 5).

The indicator 14, 114 may only operate to provide the battery charge level indication when the vehicle is not operating or is turned off (or when the vehicle/battery is being charged), or the BCM or ECU may only communicate a battery charge level signal to the indicator 14, 114 when the vehicle is not operating or is turned off (or when the vehicle/battery is being charged). Thus, the indicator 14, 114 provides the turn signal indication responsive to actuation of a turn signal function at any time when the vehicle is being driven or the vehicle is "on" (such as when the ignition is on for the vehicle) and provides the battery charge indication responsive to the battery charge level signal when the vehicle is "off" or not operating. Optionally, the indicator 14, 114 may only provide the battery charge indication function responsive to a user input, such that a person at the side of the vehicle may press a button or actuate another input to cause the indicator 14, 114 to emit the charge indicating light that is indicative of the level of battery charge for the battery of the vehicle. Such a user input function may only be operable when the vehicle is off or not operating or not moving.

Thus, the present invention provides a means for a driver (or other user) of a vehicle to quickly and easily observe the vehicle charge level of a charging (or otherwise parked) electric vehicle by observing the illumination from the vehicle's STI(s). For example, the vehicle may indicate the vehicle charge level through the color or quantity of light emitted by the STI(s).

Optionally, the turn signal unit and exterior rearview mirror assembly may utilize aspects of U.S. Publication No. US-2018-0010760, which is hereby incorporated herein by reference in its entirety.

Changes and modifications in the specifically described embodiments may be carried out without departing from the principles of the present invention, which is intended to be limited only by the scope of the appended claims as interpreted according to the principles of patent law.

The invention claimed is:

1. A vehicular exterior mirror assembly, wherein the exterior mirror assembly is configured to be disposed at a side of a vehicle equipped with the exterior mirror assembly, the exterior mirror assembly comprising:
   a turn signal unit disposed at a mirror casing of the exterior mirror assembly;
   wherein the turn signal unit comprises a housing portion, a first light source, a second light source and a lens;
   wherein, with the exterior mirror assembly disposed at the side of the equipped vehicle, light emitted by the first light source or the second light source, when the first light source or the second light source is electrically powered, passes through the lens in the direction of forward travel of the equipped vehicle;
   wherein the first light source is actuated responsive to a charge level signal indicative of a vehicle charge level of a power source of the equipped vehicle when the equipped vehicle is in a charging state;
   wherein the turn signal unit, with the exterior mirror assembly disposed at the side of the equipped vehicle, and responsive to the charge level signal indicative of the vehicle charge level of the power source of the equipped vehicle, emits light to indicate the vehicle charge level;
   wherein the turn signal unit operates responsive to the charge level signal to emit light to indicate the vehicle charge level responsive in part to a user input that actuates the first light source to emit the charging indication when the equipped vehicle is in a non-driving state;
   wherein the second light source is actuated responsive to actuation of a turn signal indicator of the equipped vehicle when the equipped vehicle is in a driving state; and
   wherein the turn signal unit, with the exterior mirror assembly disposed at the side of the equipped vehicle, and responsive to actuation of the turn signal indicator of the equipped vehicle, emits light via actuation of the second light source to provide a turn signal indication.

2. The vehicular exterior mirror assembly of claim 1, wherein the first light source comprises a multicolor light emitting diode (LED) operable to emit colored light, and wherein color of the emitted light, when the multicolor LED is electrically powered, varies responsive to the charge level signal indicative of the vehicle charge level so as to be variably indicative of different vehicle charge levels.

3. The vehicular exterior mirror assembly of claim 2, wherein, responsive to the charge level signal being indicative of a low vehicle charge level, the multicolor LED emits red light, and wherein, responsive to the charge level signal being indicative of a high vehicle charge level, the multicolor LED emits green light.

4. The vehicular exterior mirror assembly of claim 3, wherein the second light source comprises a second multicolor light emitting diode (LED), and wherein, responsive to actuation of the turn signal indicator of the equipped vehicle, the second multicolor LED operates to emit amber light.

5. The vehicular exterior mirror assembly of claim 2, wherein the turn signal unit further comprises a light guide that is disposed along the lens, and wherein the light guide receives light emitted by the multicolor LED when the multicolor LED is electrically powered.

6. The vehicular exterior mirror assembly of claim 5, wherein the lens is disposed in front of the light guide, and wherein the lens is attached at the housing portion to encase the light guide in the turn signal unit.

7. The vehicular exterior mirror assembly of claim 6, wherein the second light source comprises a turn signal indicating light emitting diode (LED), and wherein the light guide receives light emitted by the turn signal indicating LED when the turn signal indicating LED is electrically powered responsive to actuation of the turn signal indicator of the equipped vehicle.

8. The vehicular exterior mirror assembly of claim 7, wherein the light guide has a first inlet for receiving light emitted by the multicolor LED when electrically powered and a second inlet for receiving light emitted by the turn signal indicating LED when electrically powered.

9. The vehicular exterior mirror assembly of claim 1, wherein the first light source comprises a plurality of light emitting diodes (LEDs) disposed along the lens, and wherein, responsive to the charge level signal indicative of the vehicle charge level, the turn signal unit indicates the current vehicle charge level by energizing one or more of the LEDs of the plurality of LEDs in accordance with the charge level signal.

10. The vehicular exterior mirror assembly of claim 9, wherein the turn signal unit energizes more LEDs of the plurality of LEDs in response to the vehicle charge level increasing.

11. The vehicular exterior mirror assembly of claim 9, wherein the lens is disposed in front of the plurality of LEDs, and wherein the lens is attached at the housing portion to encase the LEDs in the turn signal unit.

12. The vehicular exterior mirror assembly of claim 1, wherein the charge level signal is generated by a power source monitoring system of the equipped vehicle and communicated to the turn signal unit via a communication bus and a body control module of the equipped vehicle.

13. The vehicular exterior mirror assembly of claim 1, wherein the second light source of the turn signal unit emits light to provide the turn signal indication responsive to another signal indicative of actuation of the turn signal indicator of the equipped vehicle, and wherein the other signal is communicated to the turn signal indicator via a communication bus and a body control module of the equipped vehicle.

14. A vehicular exterior mirror assembly, wherein the exterior mirror assembly is configured to be disposed at a side of a vehicle equipped with the exterior mirror assembly, the exterior mirror assembly comprising:
   a turn signal unit disposed at a mirror casing of the exterior mirror assembly;
   wherein the turn signal unit comprises a housing portion, a first light source, a second light source and a lens;
   wherein, with the exterior mirror assembly disposed at the side of the equipped vehicle, light emitted by the first or second light source, when the first or second light source is electrically powered, passes through the lens in the direction of forward travel of the equipped vehicle;
   wherein the first light source is actuated responsive to a charge level signal indicative of a vehicle charge level of a power source of the equipped vehicle when the equipped vehicle is in a charging state;
   wherein the turn signal unit operates responsive to the charge level signal to emit light to indicate the vehicle charge level responsive in part to a user input that actuates the first light source to emit the charging indication when the equipped vehicle is in a non-driving state;
   wherein the turn signal unit, with the exterior mirror assembly disposed at the side of the equipped vehicle, and responsive to the charge level signal indicative of the vehicle charge level of the power source of the equipped vehicle, emits light via actuation of the first light source to indicate the vehicle charge level;

wherein the second light source is actuated responsive to actuation of a turn signal indicator of the equipped vehicle when the equipped vehicle is in a driving state; and wherein the turn signal unit, with the exterior mirror assembly disposed at the side of the equipped vehicle, and responsive to actuation of the turn signal indicator of the equipped vehicle, emits light via actuation of the second light source to provide a turn signal indication.

15. The vehicular exterior mirror assembly of claim 14, wherein the first light source comprises a multicolor light emitting diode (LED) operable to emit colored light, and wherein color of the emitted light, when the multicolor LED is electrically powered, varies responsive to the charge level signal indicative of the vehicle charge level so as to be variably indicative of different vehicle charge levels.

16. The vehicular exterior mirror assembly of claim 15, wherein the turn signal unit further comprises a light guide that is disposed along the lens, and wherein the light guide receives light emitted by the first light source when the first light source is actuated.

17. The vehicular exterior mirror assembly of claim 16, wherein the light guide receives light emitted by the second light source when the second light source is actuated responsive to actuation of the turn signal indicator of the equipped vehicle.

18. The vehicular exterior mirror assembly of claim 17, wherein the light guide has a first inlet for receiving light emitted by the first light source when actuated and a second inlet for receiving light emitted by the second light source when actuated.

19. The vehicular exterior mirror assembly of claim 14, wherein the first light source comprises a plurality of light emitting diodes (LEDs) disposed along the lens, and wherein, responsive to the charge level signal indicative of the vehicle charge level, the turn signal unit indicates the current vehicle charge level by energizing one or more of the LEDs of the plurality of LEDs in accordance with the charge level signal.

20. A vehicular exterior mirror assembly, wherein the exterior mirror assembly is configured to be disposed at a side of a vehicle equipped with the exterior mirror assembly, the exterior mirror assembly comprising:

a turn signal unit disposed at a mirror casing of the exterior mirror assembly;

wherein the turn signal unit comprises a housing portion, at least one first light emitting diode (LED), at least one second light emitting diode (LED), and a lens;

wherein, with the exterior mirror assembly disposed at the side of the equipped vehicle, light emitted by the at least one first LED or the at least one second LED, when the at least one first LED or the at least one second LED is electrically powered, passes through the lens in the direction of forward travel of the equipped vehicle;

wherein the turn signal unit, with the exterior mirror assembly disposed at the side of the equipped vehicle, and responsive to a charge level signal indicative of a vehicle charge level of a power source of the equipped vehicle when the equipped vehicle is in a charging state, actuates the at least one first LED and emits light to indicate the vehicle charge level;

wherein the turn signal unit operates responsive to the charge level signal to emit light to indicate the vehicle charge level responsive in part to a user input that actuates the at least one first LED to emit the charging indication when the equipped vehicle is in a non-driving state;

wherein the at least one second LED is actuated responsive to actuation of a turn signal indicator of the equipped vehicle when the equipped vehicle is in a driving state; and wherein the turn signal unit, with the exterior mirror assembly disposed at the side of the equipped vehicle, and responsive to actuation of the turn signal indicator of the equipped vehicle when the equipped vehicle is in the driving state, actuates the at least one second LED and emits amber light to provide a turn signal indication.

21. The vehicular exterior mirror assembly of claim 20, wherein the at least one first LED comprises a multicolor light emitting diode (LED) operable to emit colored light, and wherein color of the emitted light, when the multicolor LED is actuated, varies responsive to the charge level signal indicative of the vehicle charge level so as to be variably indicative of different vehicle charge levels.

22. The vehicular exterior mirror assembly of claim 21, wherein the turn signal unit further comprises at least one light guide that is disposed along the lens, and wherein the at least one light guide receives light emitted by the multicolor LED when the multicolor LED is actuated and receives light emitted by the at least one second LED when the at least one second LED is actuated.

23. The vehicular exterior mirror assembly of claim 20, wherein the at least one first LED comprises a plurality of first LEDs disposed along the lens, and wherein, responsive to the charge level signal indicative of the vehicle charge level, the turn signal unit indicates the current vehicle charge level by actuating one or more of the first LEDs of the plurality of first LEDs in accordance with the charge level signal.

* * * * *